(12) United States Patent
Watanabe et al.

(10) Patent No.: US 8,367,536 B2
(45) Date of Patent: Feb. 5, 2013

(54) METHOD FOR MANUFACTURING SILICON CARBIDE SEMICONDUCTOR DEVICE

(75) Inventors: Hiroshi Watanabe, Tokyo (JP); Naruhisa Miura, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 13/319,739

(22) PCT Filed: Jul. 16, 2010

(86) PCT No.: PCT/JP2010/062053
§ 371 (c)(1),
(2), (4) Date: Nov. 10, 2011

(87) PCT Pub. No.: WO2011/010608
PCT Pub. Date: Jan. 27, 2011

(65) Prior Publication Data
US 2012/0058617 A1    Mar. 8, 2012

(30) Foreign Application Priority Data
Jul. 24, 2009  (JP) .................................. 2009-173231

(51) Int. Cl.
*H01L 21/3205* (2006.01)
*H01L 21/4763* (2006.01)
(52) U.S. Cl. .................. 438/590; 257/77; 257/E21.054; 257/E21.065; 438/931
(58) Field of Classification Search .................... 257/77, 257/E21.054, E21.065; 438/590, 931
See application file for complete search history.

(56) References Cited

U.S. PATENT DOCUMENTS 5,629,531 A * 5/1997 Palmour .......................... 257/77
6,054,352 A   4/2000 Ueno
(Continued)

FOREIGN PATENT DOCUMENTS

JP   10-233503   9/1998
JP   11-195655   7/1999
(Continued)

OTHER PUBLICATIONS

U.S. Appl. No. 13/258,941, filed Sep. 22, 2011, Matsuno, et al.
(Continued)

*Primary Examiner* — Asok K Sarkar
(74) *Attorney, Agent, or Firm* — Oblon, Spivak, McClelland, Maier & Neustadt, L.L.P.

(57) ABSTRACT

The present invention includes steps below: (a) forming, on a drift layer, a first ion implantation mask and a second ion implantation mask individually by photolithography to form a third ion implantation mask, the first ion implantation mask having a mask region corresponding to a channel region and having a first opening corresponding to a source region, the second ion implantation mask being positioned in contact with an outer edge of the first ion implantation mask and configured to form a base region; (b) implanting impurities of a first conductivity type from the first opening with an ion beam using the third ion implantation mask to form a source region in an upper layer part of the silicon carbide drift layer; (c) removing the first ion implantation mask after the formation of the source region; and (d) implanting impurities of a second conductivity type with an ion beam from a second opening formed in the second ion implantation mask after the removal of the first ion implantation mask to form a base region deeper than the source region in the upper layer part of the drift layer.

8 Claims, 6 Drawing Sheets

U.S. PATENT DOCUMENTS

| | | | |
|---|---|---|---|
| 6,117,735 A | 9/2000 | Ueno | |
| 6,297,100 B1* | 10/2001 | Kumar et al. | 438/268 |
| 6,455,892 B1* | 9/2002 | Okuno et al. | 257/328 |
| 6,465,807 B1 | 10/2002 | Ueno | |
| 6,737,677 B2* | 5/2004 | Shimoida et al. | 257/77 |
| 7,745,276 B2* | 6/2010 | Okuno et al. | 438/198 |
| 7,790,557 B2* | 9/2010 | Tsuji | 438/285 |
| 7,880,173 B2* | 2/2011 | Fukuda et al. | 257/77 |
| 8,039,204 B2 | 10/2011 | Watanabe | |
| 2008/0318438 A1* | 12/2008 | Nakamura et al. | 438/770 |
| 2009/0014719 A1* | 1/2009 | Shimizu et al. | 257/49 |
| 2009/0090919 A1* | 4/2009 | Uchida | 257/77 |
| 2009/0090920 A1* | 4/2009 | Endo et al. | 257/77 |
| 2010/0308343 A1* | 12/2010 | Suzuki et al. | 257/77 |
| 2011/0012130 A1* | 1/2011 | Zhang | 257/77 |
| 2011/0031507 A1* | 2/2011 | Tamaso | 257/77 |
| 2011/0057202 A1* | 3/2011 | Kono et al. | 257/77 |
| 2011/0121318 A1* | 5/2011 | Das et al. | 257/77 |
| 2011/0254016 A1* | 10/2011 | Ryu | 257/77 |
| 2012/0228638 A1* | 9/2012 | Das et al. | 257/77 |

FOREIGN PATENT DOCUMENTS

| | | |
|---|---|---|
| JP | 2005-33192 | 2/2005 |
| JP | 2005-252157 | 9/2005 |
| JP | 2006-32411 | 2/2006 |
| JP | 2006-128191 | 5/2006 |
| JP | 2007-141940 | 6/2007 |

OTHER PUBLICATIONS

International Search Report issued Aug. 10, 2010 in patent application No. PCT/JP2010/062053.

International Preliminary Report on Patentability and Written Opinion with English translation issued Feb. 16, 2012 in patent application No. PCT/JP2010/062053 filed Jul. 16, 2010.

* cited by examiner

METHOD FOR MANUFACTURING SILICON CARBIDE SEMICONDUCTOR DEVICE

TECHNICAL FIELD

The present invention relates to a method for manufacturing a silicon carbide semiconductor device, and more particularly, to a method for manufacturing a silicon carbide semiconductor device in which the number of steps of forming an impurity region is reduced.

BACKGROUND ART

The method for manufacturing a MOS field effect transistor (MOSFET) including a silicon carbide semiconductor has a problem that the double diffusion technique, which is one of self-alignment techniques for channel formation, cannot be used due to a small diffusion coefficient of a dopant in silicon carbide. Therefore, there are several conceivable methods for solving this problem.

For example, in Patent Document 1, a second ion implantation mask is formed on a side wall of a first ion implantation mask, and a channel region is formed in a self-alignment manner such that the channel length is identical to the film thickness of the second ion implantation mask.

In Patent Document 2, an opening of a first ion implantation mask is filled with a second ion implantation mask after the first ion implantation, and then the second ion implantation is performed with a part of the first ion implantation mask being open, whereby a second ion implanted region is formed in a self-alignment manner with a first ion implanted region.

PRIOR ART DOCUMENTS

Patent Documents
    Patent Document 1: Japanese Patent Application Laid-Open No. 2006-128191
    Patent Document 2: Japanese Patent Application Laid-Open No. 2006-32411

SUMMARY OF THE INVENTION

Problems to be Solved by the Invention
    In the method for forming a channel region in a self-alignment manner described in Patent Document 1, the material for the second ion implantation mask is deposited by a low pressure chemical vapor deposition (LPCVD) method after the formation of the first ion implantation mask, and the entire surface is etched back, to thereby form the second ion implantation mask on the side surface of the first ion implantation mask. Unfortunately, the corner part of the upper part of the second ion implantation mask is also etched when the entire surface is etched back, which makes it difficult to form the side surface of the second ion implantation mask perpendicularly. This blurs a boundary part between the first ion implanted region and the second ion implanted region, leading to degradation in the controllability of a channel dimension.

Further, the inorganic mask forming step, pattern transfer step and etching step are required in the step of forming the second ion implantation mask, and the step number is hard to be reduced.

In the method for forming an implanted region in a self-alignment manner described in Patent Document 2, the pattern of an ion implantation mask is formed by the combination of the pattern transfer step and etching step, which reduces the accuracy of the ion implantation mask pattern dimension. In addition, with the use of an inorganic mask as an ion implantation mask, the film forming step, pattern transfer step and etching step are required, which makes it difficult to reduce the step number for forming an implanted region in a self-alignment manner.

The present invention has been made to solve the above-mentioned problems, and an object thereof is to provide, in manufacturing a silicon carbide semiconductor device, a method for manufacturing a silicon carbide semiconductor device in which the step number can be reduced in a case where an ion implanted region is formed in a self-alignment manner.
Means to Solve the Problems
    An aspect of the present invention relates to a method for manufacturing a silicon carbide semiconductor device including a silicon carbide drift layer of a first conductivity type positioned on a main surface of a silicon carbide substrate, a base region of a second conductivity type positioned in an upper layer part of the silicon carbide drift layer, a source region of the second conductivity type positioned in a surface of the base region, and a gate electrode positioned above the source region, the base region and the silicon carbide drift layer through a gate insulating film, in which an outer edge of the source region is positioned on an inner side than an outer edge of the base region, and a region of the base region positioned outside of the outer edge of the source region and positioned directly below the gate electrode corresponds to a channel region, the method including the steps of: (a) forming, on the silicon carbide drift layer, a first ion implantation mask and a second ion implantation mask individually by photolithography to form a third ion implantation mask, the first ion implantation mask having a mask region corresponding to the channel region on the silicon carbide drift layer and having a first opening corresponding to the source region, the second ion implantation mask being positioned in contact with an outer edge of the first ion implantation mask and configured to form a base region; (b) implanting impurities of the first conductivity type from the first opening with an ion beam using the third ion implantation mask to form the source region in the upper layer part of the silicon carbide drift layer; (c) removing the first ion implantation mask after the formation of the source region; and (d) implanting impurities of the second conductivity type with an ion beam from a second opening formed in the second ion implantation mask after the removal of the first ion implantation mask to form the base region deeper than the source region in the upper layer part of the silicon carbide drift layer.
Effects of the Invention
    According to the method for manufacturing a silicon carbide semiconductor device of the present invention, the source region can be formed in a self-alignment manner with the use of the first ion implantation mask in which a region corresponding to the channel region is a mask region. Accordingly, the base region can be formed in a self-alignment manner in the upper layer part of the silicon carbide drift layer by implanting impurities of the second conductivity type with an ion beam from the second opening formed in the second ion implantation mask after the removal of the first ion implantation mask.

Further, the channel dimension can be appropriately determined in accordance with the dimension of the transfer pattern of the first ion implantation mask, and the transfer pattern can be formed by one exposure. Accordingly, an error does not occur in superimposition, which enables the formation of a channel region with high accuracy.

Further, an inorganic mask is not used as an ion implantation mask, which results in a reduction of the film forming steps and etching steps.

Further, the step of removing the third ion implantation mask includes the step of removing an altered implantation layer of the third ion implantation mask by ashing with oxygen plasma and the wet etching step with the use of the developer of the resist 1 or the solvent of the resist 1.

BEST MODES FOR CARRYING OUT THE INVENTION

<Introduction>

The term "MOS" has been used for the laminated structure of metal/oxide/semiconductor, which stands for metal-oxide-semiconductor. In particular, as to field effect transistors having the MOS structure (hereinafter, merely referred to as "MOS transistors"), materials for a gate insulating film and a gate electrode are improved in view of recent improvements in integration and manufacturing process.

For example, as to a MOS transistor, polysilicon is used as the material for a gate electrode in place of metal mainly in view of the formation of a source and a drain in a self-alignment manner. Further, a material having high permittivity is used as the material for a gate insulating film in view of improving electrical characteristics, but the material is not necessarily limited to an oxide.

Therefore, the term "MOS" is not necessarily limited to the laminated structure of metal/oxide/semiconductor, and also this specification is not predicated upon such limitation. That is, in view of the common technical knowledge, herein, "MOS" is not to be defined merely as an abbreviation derived from its origin but also to be defined more broadly including the laminated structure of conductor/insulator/semiconductor.

<Embodiment>
<Device Configuration>

Figure 1:
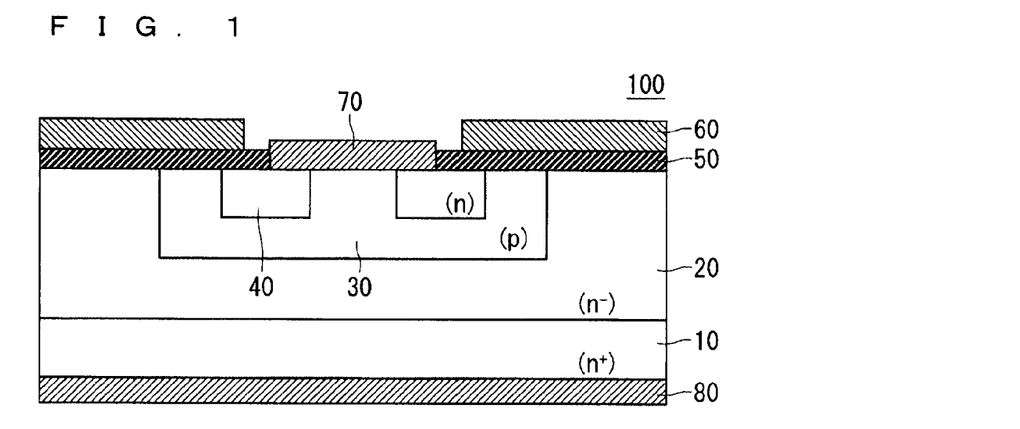
FIG. 1 is a view showing a cross-sectional structure of a MOSFET manufactured by a method for manufacturing a silicon carbide semiconductor device according to an embodiment.

FIG. 1 is a view showing a cross-sectional structure of a MOSFET 100 manufactured by a method for manufacturing a silicon carbide semiconductor device according to a first embodiment of the present invention. In the present embodiment, description is given by referring to n-type and p-type as the first conductivity type and second conductivity type, respectively.

As shown in FIG. 1, the MOSFET 100 includes a drift layer 20 (silicon carbide layer) of the first conductivity type that is formed on a first main surface of a silicon carbide substrate 10 of the first conductivity type, a base region 30 of the second conductivity type that is formed in the upper layer part of the drift layer 2 so as to reach a first depth, and two source regions 40 of the first conductivity type that are formed in the surface of the base region 30 with a spacing so as to reach a second depth. The second depth is formed to be smaller than the first depth.

The silicon carbide substrate 10 is a substrate that has the first main surface whose plane direction is a (0001) plane, has a 4H polytype, contains impurities of the first conductivity type at a relatively high concentration ($n^+$) and has low resistance.

The drift layer 20 is formed by the epitaxial growth method so as to contain impurities of the first conductivity type at a relatively low concentration ($n^-$).

The base region 30 contains aluminum (Al) being impurities of the second conductivity type, and the source region 40 contains nitrogen (N) being impurities of the first conductivity type.

Formed on the main surface of the silicon carbide drift layer 20 on the side on which the base region 30 and the source regions 40 are formed is a source electrode 70, which is formed so as to straddle the opposing source regions 40 and be in contact with parts of the opposing source regions 40 and the base region 30 between the source regions 40.

A gate insulating film 50 composed of silicon oxide is formed on the main surface of the silicon carbide drift layer 20 on the side on which the base region 30 and the source regions 40 are formed, except for the region in which the source electrode 70 is formed.

Further, a gate electrode 60 is formed on the gate insulating film 50 so as not to be brought into contact with the source electrode 70, at a spacing from the edges of the source electrode 70.

A drain electrode 80 is formed on a second main surface of the silicon carbide substrate 10 on the side opposite to the first main surface, that is, on the back surface side.

With reference to FIG. 1, a channel region refers to the region of the base region 30, which is opposed to the gate electrode 60 through the gate insulating film 50 and in which an inversion layer is formed during ON operation. In addition, a channel length refers to the length of the channel region between the region into which ion is not implanted and the source region 40 in the surface layer part of the drift layer 20.

In the MOSFET 100, a principal current flows in the vertical direction over a path formed by the source regions 40, channel region, drift layer 20 and silicon carbide substrate 10, and accordingly the MOSFET 100 is referred to as a vertical MOSFET.

Figure 2:
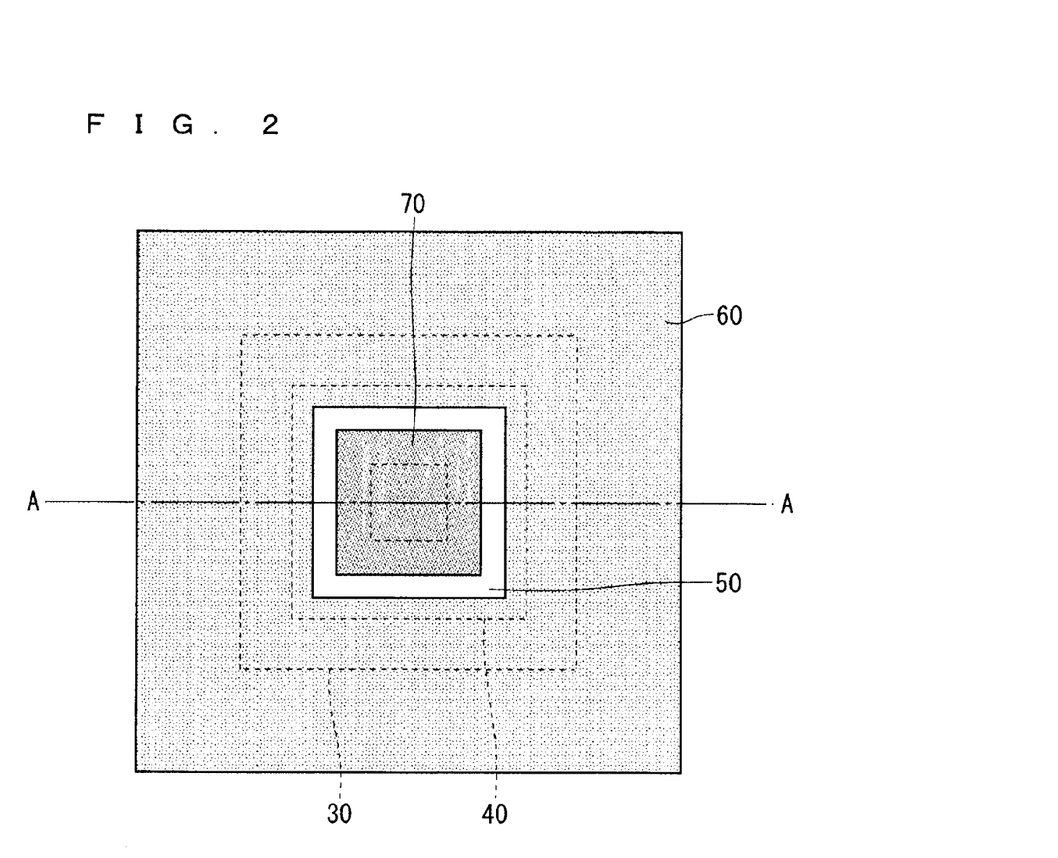
FIG. 2 is a plan view showing the MOSFET viewed from the side on which a gate electrode is formed.

FIG. 2 is a plan view showing the MOSFET 100 viewed from the side on which the gate electrode 60 is formed.

Figure 7:
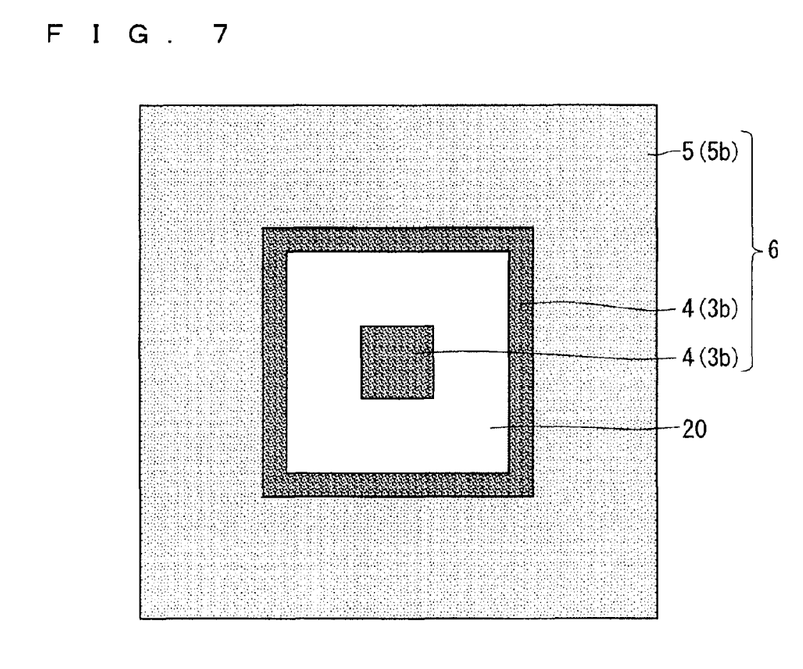
FIG. 7 is a plan view in the manufacturing process for the silicon carbide semiconductor device according to the embodiment.

As shown in FIG. 2, the source region 40 has a rectangular annular shape so as to surround the square-shaped source electrode 70. Note that the MOSFET 100 shown in FIG. 7 is one unit, and a plurality of similar configurations are formed on the silicon carbide substrate 10.

<Manufacturing Method>

Next, the method for manufacturing a silicon carbide semiconductor device according to the first embodiment is described with reference to FIG. 3 to FIG. 11 by taking the method for manufacturing the MOSFET 100 as an example.

Figure 3:
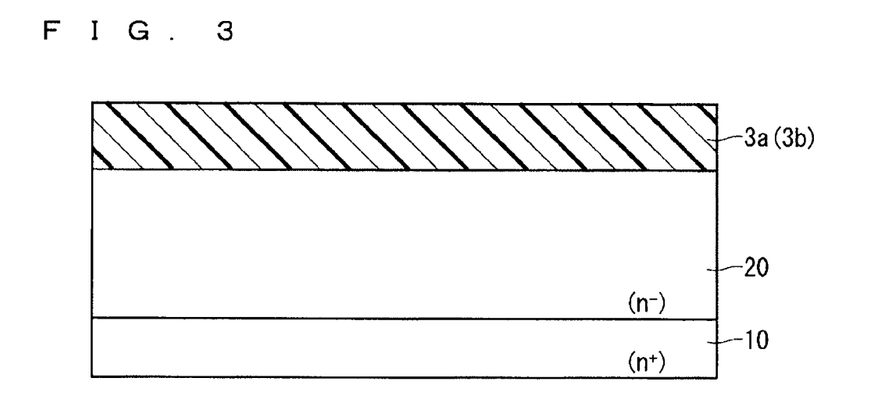
FIG. 3 is a view describing a manufacturing process for a silicon carbide semiconductor device according to the embodiment.

First, as shown in FIG. 3, the drift layer 20 containing impurities of the first conductivity type is homo-epitaxially grown on the first main surface of the silicon carbide substrate 10, which serves as an SiC underlayer.

After that, a positive resist 3a is applied onto the main surface of the drift layer 20 and is heated, to thereby form a photoresist film 3b. The positive resist 3a used herein mainly contains a photosensitive material, a base resin and an organic solvent, and turns into the photoresist film 3b having a thickness of 2.5 µm after heating.

Figure 4:
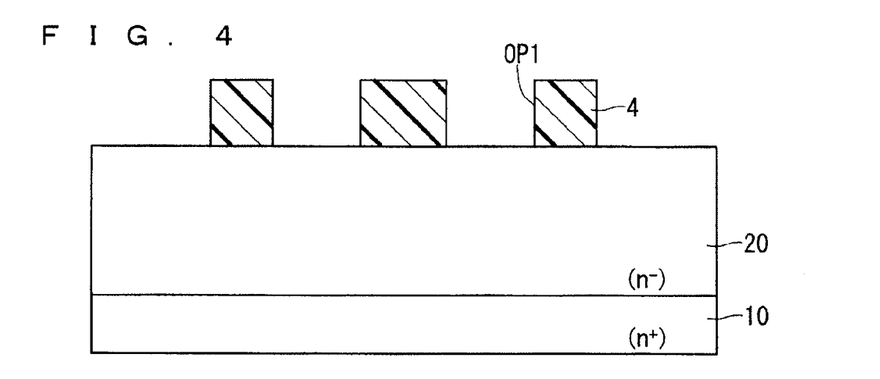
FIG. 4 is a view describing the manufacturing process for the silicon carbide semiconductor device according to the embodiment.

Next, a pattern is transferred onto the photoresist film 3b using photolithography and is then developed with an alkali developer, to thereby form, on the main surface of the drift layer 20, a first ion implantation mask 4 that has side walls perpendicular in cross section and has good rectangularity. The main surface of the drift layer 20 is exposed on the bottom of an opening OP1 of the first ion implantation mask 4.

The first ion implantation mask 4 is formed using photolithography only, and the mask pattern dimension corresponds to the channel dimension of the channel region described below.

Figure 5:
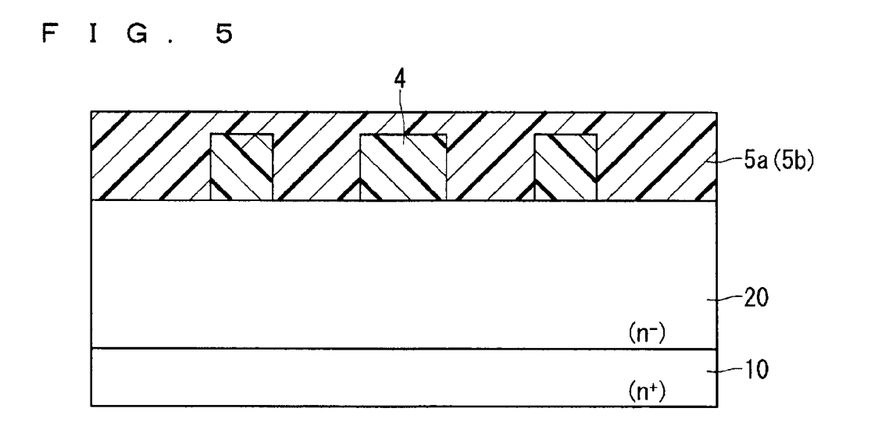
FIG. 5 is a view describing the manufacturing process for the silicon carbide semiconductor device according to the embodiment.

Next, a positive resist 5a is applied so as to cover the surfaces of the drift layer 20 and first ion implantation mask 4 in the process shown in FIG. 5 and is then heated, to thereby form a photoresist film 5b. The positive resist used in this case mainly contains a photosensitive material, a base resin and an organic solvent, which turns into the photoresist film 5b having a thickness of 2.8 µm after heating.

Here, the photoresist film 5b is formed also on the first ion implantation mask 4 to have a thickness of approximately 0.3 µm. Note that the photoresist film 5b does not have the thickness of 2.8 µm on the first ion implantation mask 4. This is because the covered area of the first ion implantation mask 4 on the silicon carbide substrate 10 is small and the width of the first ion implantation mask 4 is smaller than the thickness of the resist film, and thus when a liquid resist material (positive resist 5a) is applied, the height of the photoresist film 5b on the first ion implantation mask 4 is identical to the height of the photoresist film 5b in the location free from the first ion implantation mask 4 owing to the surface tension of the resist material.

The base resins of the positive resist 5a and the positive resist 3a are selected so as not to dissolve in the respective solvents, so that the positive resist 5a and the positive resist 3a are not mixed together when the positive resist 5a is applied onto the photoresist film 3b. Alternatively, in order to prevent the positive resist 5a and the photoresist film 3b from being mixed together, the photoresist film 3b may be further hardened so as not to cause mixing by heating the entire photoresist film 3b or irradiating the entire photoresist film 3b with ultraviolet light before application of the positive resist 5a.

Figure 6:
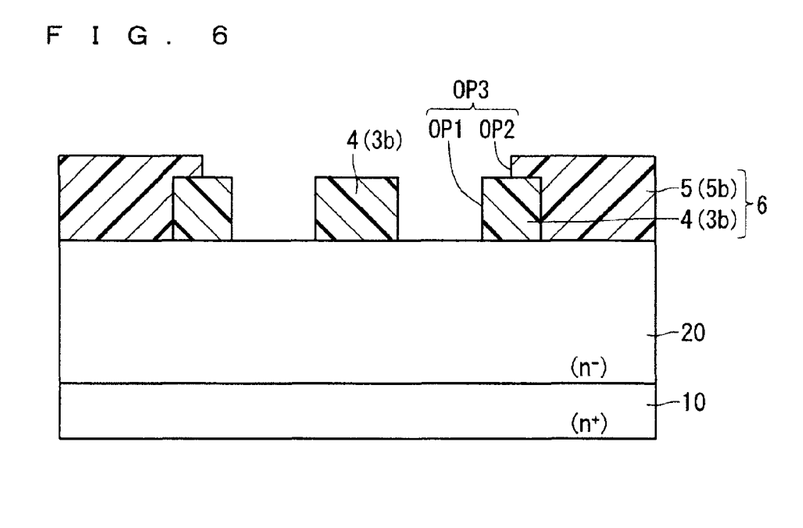
FIG. 6 is a view describing the manufacturing process for the silicon carbide semiconductor device according to the embodiment.

A pattern is transferred onto the photoresist film 5b using photolithography and is then developed with an organic developer, to thereby form a second ion implantation mask 5 formed of the photoresist film 5b as shown in FIG. 6. The opening OP1 of the first ion implantation mask 4 is included inside of the opening pattern of an opening OP2 of the second ion implantation mask 5. Accordingly, the openings OP1 and OP2 are communicated with each other, with the result that an opening OP3 is formed.

In the pattern transfer when the second ion implantation mask 5 is formed, superimposition with the first implantation mask 4 is performed such that a boundary of the opening OP2 is positioned within the first ion implantation mask 4 corresponding to the channel region.

If the superimposition accuracy on this occasion is equal to or smaller than the channel length, the dimension of the implanted region will not change. For example, in a case where the channel length is 0.5 µm, the superimposition accuracy may be ±0.25 µm or smaller.

In this manner, a third ion implantation mask 6 is formed, which is composed of the first ion implantation mask 4 and the second ion implantation mask 5 and has the opening OP3.

Here, selection is made such that the positive resist 3a does not dissolve in the developer of the positive resist 5a, whereby it is possible to selectively develop the photoresist film 5b for the photoresist film 3b. In the present embodiment, an alkaline developer is used as the developer for the positive resist 3a, and an organic developer is used as the developer for the positive resist 5a, which enables to selectively develop the resist film.

For example, an aqueous solution of 2.38 wt % tetramethyl ammonium hydroxide (TMAH) is used as an alkaline developer, and xylene or isoamyl acetate is used as an organic developer.

The above is merely an example, and various combinations are conceivable. It is essential that the pattern dimension of the first ion implantation mask 4 corresponding to the channel region should not vary during the above-mentioned process.

To that end, it is important that the photoresist film 3b should not dissolve during application of the positive resist 5a by coming into contact with the solvent of the positive resist 5a and that the photoresist film 3b should not dissolve in the developer of the photoresist film 5b.

For example, in a case where the pattern dimension of the first ion implantation mask corresponding to the channel length is 0.5 µm and the amount of allowable variation of the pattern dimension is 10%, the combination of an alkaline developer and an organic developer is determined such that the amount of dissolution of the photoresist film 3b by application or development of the positive resist 5a is 0.05 µm or smaller.

The combination of an alkaline developer and an organic developer is determined such that the development speed ratio of the photoresist film 3b to the photoresist film 5b by the same exposure amount is approximately 1/100 or smaller.

Here, the development speed is defined as a reduction amount of the film per unit time for the resist developer, and then the development speed ratio is represented as the ratio of development speed of the photoresist film 3b to the photoresist film 5b, that is, the development speed of the photoresist film 3b/the development speed of the photoresist film 5b.

In the opening OP3 of the third ion implantation mask 6, the inner side surface and a part of the upper surface of the first ion implantation mask 4 are exposed. Accordingly, similarly to the cross-sectional shape of the first ion implantation mask 4, the cross-sectional shape of the opening OP3 has the side surface perpendicular to the silicon carbide substrate 10.

FIG. 7 is a plan view showing the silicon carbide substrate 10 viewed from the third ion implantation mask 6 side in the state in which the third ion implantation mask 6 is formed. As shown in FIG. 7, a part of the first ion implantation mask 4 having a square shape in plan view is exposed in the center, and the third ion implantation mask 6 is located so as to surround the exposed part.

Figure 8:
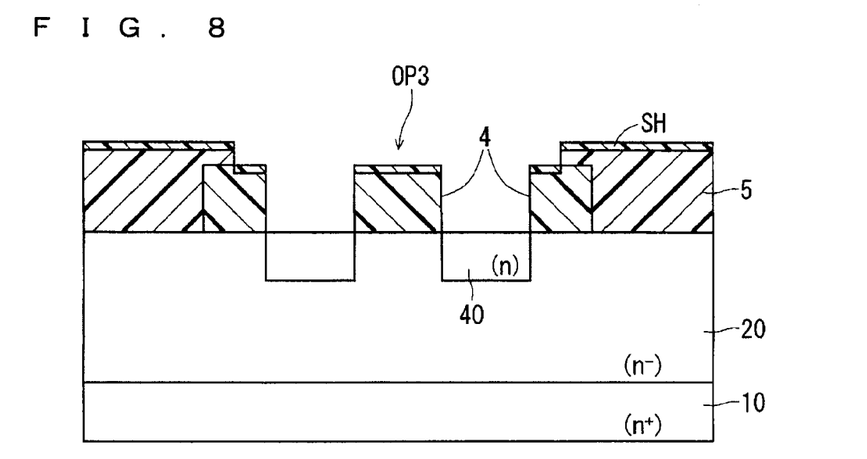
FIG. 8 is a view describing the manufacturing process for the silicon carbide semiconductor device according to the embodiment.

Next, as shown in FIG. 8, impurities of the first conductivity type are ion-implanted (first ion implantation) into the surface of the drift layer 20 through the third ion implantation mask 6, to thereby form the source region 40 (first impurity region) in the drift layer 20. On this occasion, the outer boundary of the source region 40 is defined by the first ion implantation mask 4.

As one example of ion implantation conditions, implantation is performed on the conditions that nitrogen (N) is used as impurities for ion implantation, the substrate temperature during implantation is 25° C., and the box profile in which the concentration of N is $3 \times 10^{19}/cm^3$ is formed in the region for the depth of 0.3 μm from the main surface of the silicon carbide substrate 10.

As a result of the first ion implantation, carbonization of a sensitive material and a base resin and crosslinking reaction between base resins occur in the third ion implantation mask 6 composed of a photoresist. Accordingly, in particular, the exposed portion of the first ion implantation mask 4 and the vicinity of the surface of the second ion implantation mask 5 are hardened, to thereby form a surface hardened layer SH.

Figure 9:
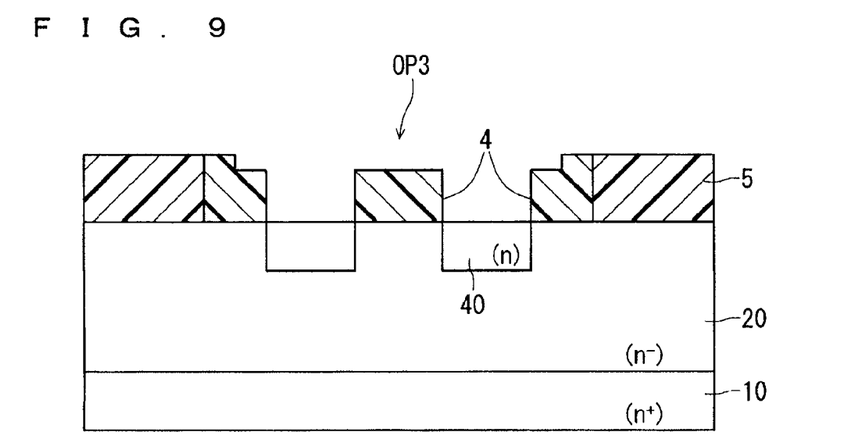
FIG. 9 is a view describing the manufacturing process for the silicon carbide semiconductor device according to the embodiment.

Next, in the process shown in FIG. 9, dry etching is performed under an oxygen plasma atmosphere, to thereby remove the surface hardened layer SH of the first ion implantation mask 4 and the second ion implantation mask 5 and the second ion implantation mask 5 located above the first ion implantation mask 4. On this occasion, the film thicknesses of the second ion implantation mask 5 and the first ion implantation mask 4 that is not covered with the second ion implantation mask 5 and is exposed to plasma reduce due to etching. The etching amount in this case is set such that the second ion implantation mask 5 (having a thickness of approximately 0.3 μm) located above the first ion implantation mask 4 is removed. This makes the first ion implantation mask 4 to have a stepwise shape. The film thickness of the second ion implantation mask 5 after etching is secured to have a thickness (1.7 μm or larger) sufficient for functioning as an implantation mask.

Alternatively, in a case where the side surfaces of the first ion implantation mask 4 and the second ion implantation mask 5 are not perpendicular but are tapered, the surface hardened layer SH is formed slightly on the side surfaces of the first ion implantation mask 4 and the second ion implantation mask 5 (not shown). However, the surface hardened layer SH thereof can also be removed by dry etching under an oxygen plasma atmosphere.

Figure 10:
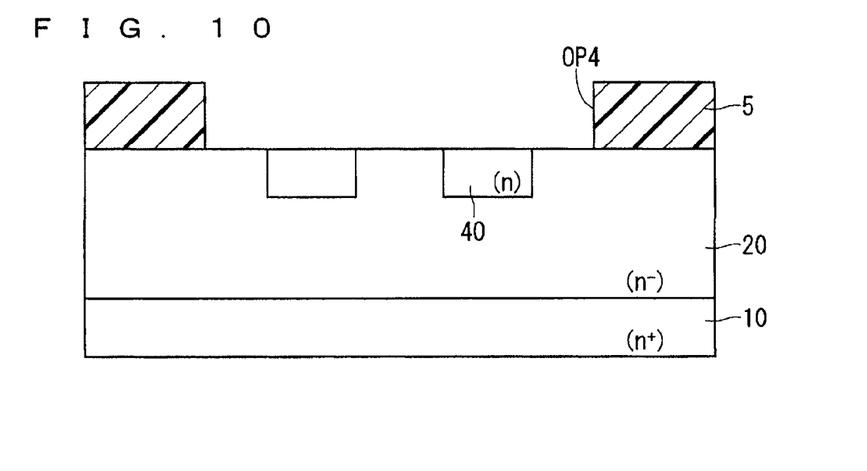
FIG. 10 is a view describing the manufacturing process for the silicon carbide semiconductor device according to the embodiment.

Next, in the process shown in FIG. 10, wet etching is performed with the use of the solvent of the photoresist film 3b forming the first ion implantation mask 4, whereby the second ion implantation mask 5 does not dissolve in this solvent, but only the first ion implantation mask 4 dissolves. Accordingly, it is possible to selectively remove the first ion implantation mask 4. This allows the second ion implantation mask 5 to have an opening OP4 having the width corresponding to the entire region of the first ion implantation mask 4.

The inner side wall of the opening OP4 is formed to be in contact with the outer side wall of the first ion implantation mask 4, and accordingly is perpendicular to the main surface of the silicon carbide substrate 10.

Figure 11:
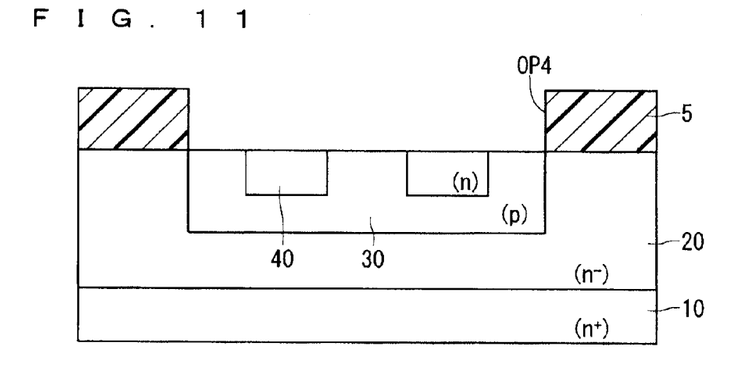
FIG. 11 is a view describing the manufacturing process for the silicon carbide semiconductor device according to the embodiment.

Next, in the process shown in FIG. 11, ion implantation (second ion implantation) of impurities of the second conductivity type is performed in the surface of the drift layer 20 through the second ion implantation mask 5, to thereby form a base region 30 (second impurity region) in the drift layer 20. In this case, the outer boundary of the base region 30 is defined by the second ion implantation mask 5.

As one example of ion implantation conditions, implantation is performed on the conditions that aluminum (Al) is used as impurities for ion implantation, the substrate temperature during implantation is 25° C., and the box profile in which the concentration of Al is $2 \times 10^{18}/cm^3$ is formed in the region for the depth of 0.8 μm from the main surface of the silicon carbide substrate 10.

The ion implantation of the second conductivity type is performed so as to overlap the source region 40 of the first conductivity type in the formation of the base region 30, where the concentration of the source region 40 is set so as not to be affected by the formation of the base region 30.

Desirably, the pattern dimension of the first ion implantation mask 4 corresponding to the channel region does not vary also in the process after the first ion implantation before the second ion implantation. To that end, it is important that the photoresist film 5b should not dissolve due to the contact with the solvent of the positive resist 3a.

That is, it suffices that the solvents of the resist forming the second ion implantation mask 5 and the resist forming the third ion implantation mask 6 do not dissolve in each other. For example, in a case where the pattern dimension of the first ion implantation mask 4 corresponding to the channel length is 0.5 μm and the amount of allowable variation of pattern dimension is 10%, the amount of dissolution of the photoresist film 5b when removing the positive resist 3a is desirably 0.05 μm or smaller.

The solvent of the resist differs depending on a base resin type of the resist. For example, the resist referred to as ZEP520 hardly dissolves in propylene glycol monomethyl ether being a novolac resin based resist solvent. Meanwhile, the novolac resin based resist hardly dissolves in orthodichlorobenzene being the solvent of ZEP520. Therefore, the condition that those hardly dissolve in each other can be satisfied through the combination thereof.

Next, the first ion implantation mask 4 and the second ion implantation mask 5 are removed, and then, the gate insulating film 50 having a desired thickness is formed on the surface of the silicon carbide substrate 10 by thermal oxidation. After that, a polycrystalline Si film is formed on the gate insulating film 50 by the LPCVD method or the like and is then patterned, to thereby form a gate electrode 60. Then, a source electrode 40, a drain electrode 80 and an internal interconnection are formed, with the result that the MOSFET 100 shown in FIG. 1 is achieved.

<Effects>

In the method for manufacturing a silicon carbide semiconductor device according to the embodiment described above, the outer boundary of the first ion implanted region and the outer boundary of the second ion implanted region are defined by the presence of the first ion implantation mask 4. The channel region corresponds to the region sandwiched between the outer boundary of the first ion implanted region and the outer boundary of the second ion implanted region, and accordingly the channel dimension is determined by the pattern dimension of the first ion implantation mask 4.

As described above, in the method for manufacturing a silicon carbide semiconductor device according to the present invention, the channel dimension can be determined appropriately in accordance with the transfer pattern dimension of the first ion implantation mask 4, and the transfer pattern is formed by one exposure. Accordingly, an error does not occur in superimposition, which allows the formation of a channel region with high accuracy.

Further, one characteristic of the above-mentioned embodiment is that the third ion implantation mask and the second ion implantation mask are formed in a self-alignment manner through the first ion implantation mask not that the third ion implantation mask and the second ion implantation mask are formed in a self-alignment manner with respect to the other ion implantation mask.

It is possible to reduce a dimensional error of the channel dimension without forming a channel region in a self-alignment manner and form the n-type source region 40 and the p-type base region 30 in a self-alignment manner. This allows the formation of an ion implanted region in a self-alignment manner and the formation of a channel region without using a technique in a self-alignment manner.

The inner surface of the second ion implantation mask 5 is covered with the first ion implantation mask 4 in the first ion implantation, which prevents the deformation of the shape of the second ion implantation mask 5 due to implantation damage in the first ion implantation and the variation of the pattern dimension of the second ion implantation mask 5. Therefore, particularly in the case where a resist is used as an ion implantation mask, remarkable effects are achieved in stably forming an implanted region that requires dimensional accuracy in, for example, a channel region.

Further, a resist composed of an organic material is used as an ion implantation mask, which does not require the step of forming an inorganic mask and the etching step that are necessary in the case of using an inorganic mask. Accordingly, the step number can be reduced compared with the method of forming an implanted region in a self-alignment manner using an organic mask.

Due to the formation of the surface hardened layer on the surface of the first ion implantation mask 4, it is difficult to selectively remove the first ion implantation mask 4 with respect to the second ion implantation mask 5 only by wet etching using the solvent of the resist forming the first ion implantation mask 4. However, the surface hardened layer on the surface of the first ion implantation mask 4 is removed by dry etching under an oxygen plasma atmosphere, which enables to selectively remove the first ion implantation mask 4.

Although dry etching and wet etching with the use of a solvent are used for removing the first ion implantation mask 4, the unexposed region of the first ion implantation mask 4 may be exposed by entirely exposing the silicon carbide substrate 10 so as to be removed by wet etching with the use of an alkaline developer.

In this case, developers in each of which the other resist does not dissolve are used in combination (combination of an alkaline developer and an organic developer or combination of an organic developer and an organic developer of another type) such that the resist forming the first ion implantation mask 4 does not dissolve in the developer of the resist forming the second ion implantation mask 5 and that the resist forming the second ion implantation mask 5 does not dissolve in the developer of the resist forming the first ion implantation mask 4. This enables the treatment with high selectivity.

<Modification>

While the first ion implantation mask 4 corresponding to the channel region is formed as a resist pattern in the embodiment described above, as a modification of the embodiment, a method of forming the first ion implantation mask from the opening pattern of a resist is described with reference to FIG. 12 to FIG. 15.

Figure 12:
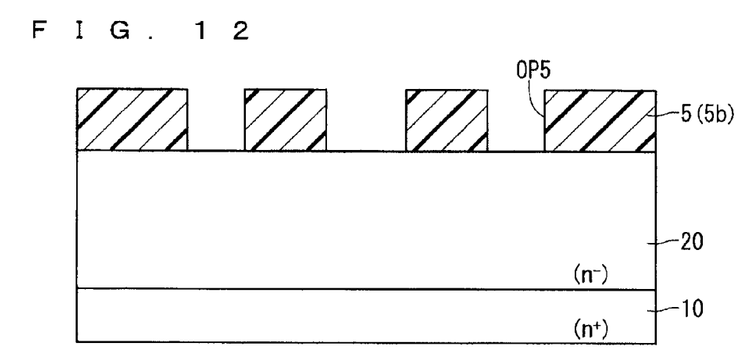
FIG. 12 is a view describing a manufacturing process for a silicon carbide semiconductor device according to a modification of the embodiment.

First, as shown in FIG. 12, the drift layer 20 containing impurities of the first conductivity type are homo-epitaxially grown on the first main surface of the silicon carbide substrate 10, which serves as an SiC underlayer.

After that, the positive resist 5a is applied onto the main surface of the drift layer 20 and is then heated, to thereby form the photoresist film 5b. The positive resist 5a used in this case mainly contains a photosensitive material, a base resin and an organic solvent, which turns into the photoresist film 5b having a thickness of 2.5 μm after heating.

A pattern is transferred onto the photoresist film 5b by photolithography and is then developed with an organic developer, to thereby form the second ion implantation mask 5 composed of the photoresist film 5b.

The photoresist film 5b after photolithography covers a non-implanted region of the drift layer 20 and the source region and has an opening pattern in which the portion corresponding to the channel region is an opening OP5.

Figure 13:
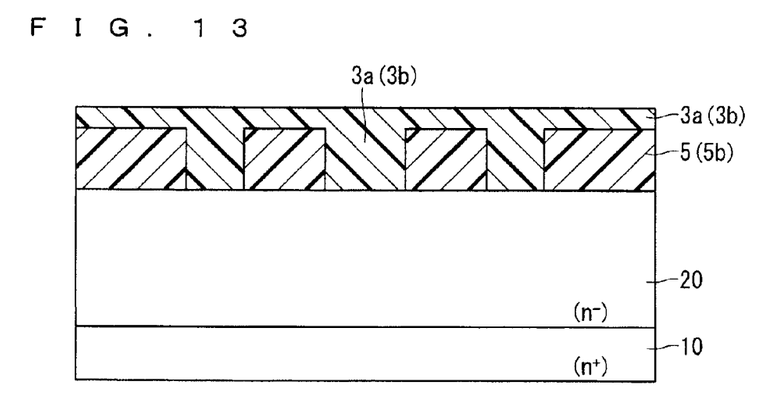
FIG. 13 is a view describing the manufacturing process for the silicon carbide semiconductor device according to the modification of the embodiment.

Next, in the process shown in FIG. 13, the positive resist 3a is applied so as to fill the opening OP5 of the second ion implantation mask 5. As a result, the portion corresponding to the channel region is covered with the positive resist 3a.

Then, the photoresist film 3b is formed by heating the positive resist 3a. The positive resist 3a used herein mainly contains a photosensitive material, a base resin and an organic solvent. While the photoresist film 3b is also formed on the photoresist film 5b, that portion has a thickness of approximately 0.5 μm.

Figure 14:
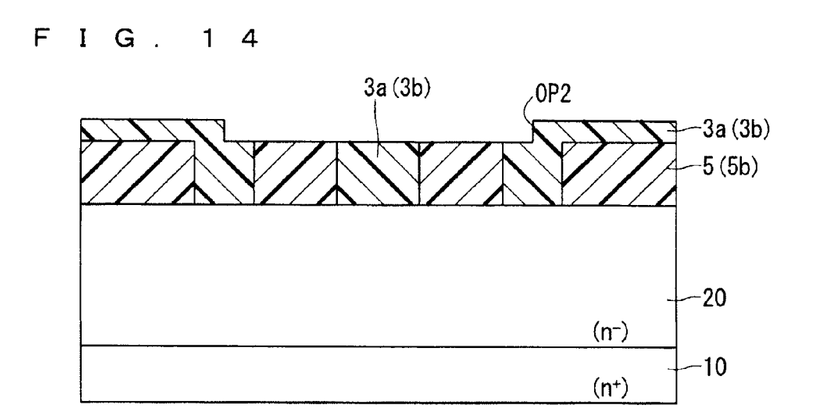
FIG. 14 is a view describing the manufacturing process for the silicon carbide semiconductor device according to the modification of the embodiment.

Next, in the process shown in FIG. 14, a pattern is transferred onto the photoresist film 3b by photolithography and is then developed with an organic developer, to thereby provide the opening OP2 at the center part of the photoresist film 3b. In this pattern transfer, transfer patterns are superimposed such that the outer edge of the opening OP2 is positioned almost above the center of the portion that will turn into a channel region. After being exposed, development is performed with an alkaline developer, and accordingly the photoresist film 3b of the portion corresponding to the opening OP2 gradually dissolves in the developer. Development is finished at the time when the photoresist film 5b above the portion that will turn into the source region 40 is exposed. In this case, one that does not dissolve in the developer (alkaline developer) of the positive resist 3a is selected as the positive resist 5a.

The photoresist film 5b corresponding to the portion above the non-implanted region (region outside of the portion that will turn into a channel region) is not included in the opening OP2 and is covered with the photoresist film 3b, and thus is not exposed after development. It is clear in advance that the photoresist film 3b on the photoresist film 5b has a thickness of approximately 0.5 μm as a set value, whereby it is possible to easily finish development at the time when the photoresist film 3b on the photoresist film 5b disappears by adjusting the development time or exposure amount.

In the region corresponding to the opening OP2, as described above, the thickness of the photoresist film 3b decreases due to development in the region that includes only the photoresist film 3b but does not include the photoresist film 5b.

However, not all of the photoresist film 3b disappears due to development. While the photoresist film 3b is formed to have a recessed shape with a thickness becoming smaller in the opening OP2, it is possible for the photoresist film 3b to have a similar thickness to the thickness of the photoresist film 5b even after development.

Then, the photoresist film 5b in the region corresponding to the source region is selectively removed with respect to the photoresist film 3b by organic development, to thereby form the opening OP1 in which the main surface of the drift layer 20 is exposed on the bottom thereof. Accordingly, the opening OP3 in which the openings OP1 and OP2 are communicated with each other is formed.

In this case, it is possible to selectively develop the photoresist film 5b and the photoresist film 3b by selecting the combination such that the positive resist 5a does not dissolve in the developer of the positive resist 3a and the positive resist 3a does not dissolve in the developer of the positive resist 5a. In the present embodiment, an alkaline developer is used as the developer for the positive resist 3a and an organic developer is used as the developer for the positive resist 5a, so that the respective resist films are developed in a selective manner.

For example, an aqueous solution of 2.38 wt % tetramethyl ammonium hydroxide (TMAH) is used as an alkaline solution, and xylene or isoamyl acetate is used as an organic developer.

The above is merely an example, and various combinations are conceivable. It is essential that the pattern dimension of the first ion implantation mask 4 corresponding to the channel region should not vary during the above-mentioned process.

To that end, it is important that the photoresist film 5b should not dissolve during application of the positive resist 3a by coming into contact with the solvent of the positive resist 3a and that the photoresist film 3b should not dissolve in the developer of the photoresist film 5b.

For example, in a case where the pattern dimension of the first ion implantation mask corresponding to the channel length is 0.5 μm and the amount of allowable variation of the pattern dimension is 10%, the combination of a resist solvent and a developer is determined such that the amount of dissolution of the photoresist film 5b by application of the positive resist 3a or the amount of dissolution of the photoresist film 3b by development of the positive resist 5a is 0.05 μm or smaller.

The combination of an alkaline developer and an organic developer is determined such that the development speed ratio of the photoresist film 3b with respect to the photoresist film 5b by the same exposure amount is approximately $1/100$ or smaller.

Here, the development speed is defined as a reduction amount of the film per unit time for the resist developer, and then the development speed ratio is represented as the ratio of development speed of the photoresist film 3b to the photoresist film 5b, that is, the development speed of the photoresist film 3b/the development speed of the photoresist film 5b.

Figure 15:
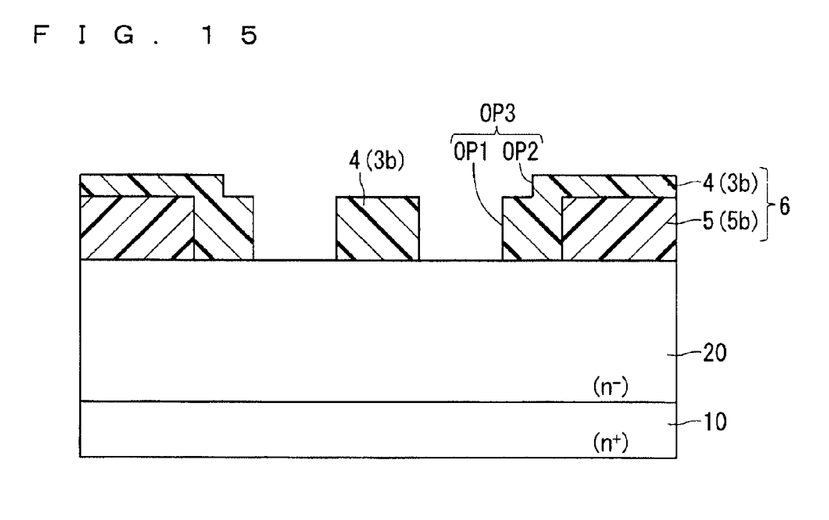
FIG. 15 is a view describing the manufacturing process for the silicon carbide semiconductor device according to the modification of the embodiment.

In this manner, the second ion implantation mask 5 formed of the photoresist film 5b and the first ion implantation mask 4 formed of the photoresist film 3 are formed as shown in FIG. 15. As a result, the third ion implantation mask 6 is formed of the first ion implantation mask 4 and the second ion implantation mask 5.

This is different from the manufacturing method of the embodiment, where the resist covering the channel region and the resist covering the upper surface of the resist covering a non-implanted region are of different types in the manufacturing method of the embodiment.

On the other hand, differently from the embodiment, the channel region is covered with the photoresist film 3b and the upper surface of the photoresist film 5b covering a non-implanted region is also covered with the photoresist film 3b of the same type in the present modification.

As a result, the surface hardened layer formed by the first ion implantation is formed only on the surface layer of the first ion implantation mask 4.

The first ion implantation mask 4 needs to be removed for performing the second ion implantation. According to the present modification, owing to dry etching under an oxygen plasma atmosphere, it is possible to selectively remove the first ion implantation mask 4 by wet etching with the use of the solvent of the photoresist 3a after the removal of the surface hardened layer.

That is, the photoresist film 3b on the second ion implantation mask 5 can be removed selectively, leading to an effect that the film thickness of the second ion implantation mask 5 does not reduce. This prevents the ion implantation into a non-implanted region with reliability.

Further, the second ion implantation mask 5 is not subjected to dry etching, and thus the cross-sectional shape of the second ion implantation mask 5 does not deform and the pattern dimension does not vary. This achieves an effect that the pattern dimension of an implanted region does not vary.

Description of Reference Numerals 4 first ion implantation mask, 5 second ion implantation mask, 6 third ion implantation mask, 10 silicon carbide substrate, 20 silicon carbide drift layer, 30 base region, 40 source region, 50 gate insulating film, 60 gate electrode, 70 source electrode, 80 drain electrode

The invention claimed is:

1. A method for manufacturing a silicon carbide semiconductor device including a silicon carbide drift layer of a first conductivity type positioned on a main surface of a silicon carbide substrate, a base region of a second conductivity type positioned in an upper layer part of said silicon carbide drift layer, a source region of the second conductivity type positioned in a surface of said base region, and a gate electrode positioned above said source region, said base region and said silicon carbide drift layer through a gate insulating film, in which an outer edge of said source region is positioned on an inner side than an outer edge of said base region, and a region of said base region positioned outside of the outer edge of said source region and positioned directly below said gate electrode corresponds to a channel region, the method comprising the steps of:

(a) forming, on said silicon carbide drift layer, a first ion implantation mask and a second ion implantation mask individually by photolithography to form a third ion implantation mask, said first ion implantation mask having a mask region corresponding to the channel region and having a first opening corresponding to said source region, said second ion implantation mask being positioned in contact with an outer edge of said first ion implantation mask and configured to form a base region;

(b) implanting impurities of the first conductivity type from said first opening with an ion beam using said third ion implantation mask to form said source region in the upper layer part of said silicon carbide drift layer;

(c) removing said first ion implantation mask after the formation of said source region; and (d) implanting impurities of the second conductivity type with an ion beam from a second opening formed in said second ion implantation mask after the removal of said first ion implantation mask to form said base region deeper than said source region in the upper layer part of said silicon carbide drift layer.

2. The method for manufacturing a silicon carbide semiconductor device according to claim 1, wherein said step (a) includes the step of hardening and patterning a first photoresist to form said first ion implantation mask, and then forming a second photoresist so as to cover said first ion implantation mask, hardening said second photoresist, and removing said hardened second photoresist from said first opening to form said second ion implantation mask.

3. The method for manufacturing a silicon carbide semiconductor device according to claim 2, wherein developers that do not affect each other in photolithography are used for said first and second photoresists.

4. The method for manufacturing a silicon carbide semiconductor device according to claim 2, wherein base resins each insoluble in a solvent of the other are used as base resins of said first and second photoresists.

5. The method for manufacturing a silicon carbide semiconductor device according to claim 1, wherein said step (a) includes the step of hardening and patterning a first photoresist to form said second ion implantation mask with said mask region of said first ion implantation mask as a third opening, and then forming a second photoresist so as to cover said second ion implantation mask, hardening and patterning said second photoresist so as to expose a surface of said first photoresist of a region corresponding to said first opening of said first ion implantation mask, and removing said first photoresist in the region corresponding to said first opening of said first ion implantation mask to form said first ion implantation mask.

6. The method for manufacturing a silicon carbide semiconductor device according to claim 5, wherein developers that do not affect each other in photolithography are used for said first and second photoresists.

7. The method for manufacturing a silicon carbide semiconductor device according to claim 5, wherein base resins each insoluble in a solvent of the other are used as base resins of said first and second photoresists.

8. The method for manufacturing a silicon carbide semiconductor device according to claim 1, wherein said step (c) includes, prior to the removal of said first ion implantation mask, the step of removing a surface hardened layer of said first ion implantation mask and said second ion implantation mask by dry etching under an oxygen plasma atmosphere.

* * * * *